US00RE35441E

United States Patent [19]

Yokotani et al.

[11] E Patent Number: Re. 35,441

[45] Reissued Date of Patent: Feb. 4, 1997

[54] THERMOELECTRIC SEMICONDUCTOR HAVING A POROUS STRUCTURE DEAERATED IN A VACUUM AND THERMOELECTRIC PANEL USING P-TYPE AND N-TYPE THERMOELECTRIC SEMICONDUCTORS

[75] Inventors: Youichirou Yokotani; Kouichi Kugimiya; Hamae Ando, all of Osaka, Japan

[73] Assignee: Matsushita Electrical Industrial Co., Ltd., Osaka, Japan

[21] Appl. No.: 330,565

[22] Filed: Oct. 28, 1994

Related U.S. Patent Documents

Reissue of:

[64] Patent No.: 5,168,339
Issued: Dec. 1, 1992
Appl. No.: 688,424
Filed: Apr. 22, 1991

[30] Foreign Application Priority Data

| | | | |
|---|---|---|---|
| Apr. 20, 1990 | [JP] | Japan | 2-103030 |
| Nov. 29, 1990 | [JP] | Japan | 2-335911 |
| Nov. 29, 1990 | [JP] | Japan | 2-335925 |
| Nov. 29, 1990 | [JP] | Japan | 2-335926 |

[51] Int. Cl.[6] ..... H01L 23/56

[52] U.S. Cl. ..... 257/64; 257/467; 257/468; 62/3.2; 62/3.3; 62/3.6; 136/203; 136/205; 252/70

[58] Field of Search ..... 257/64, 467, 468, 257/3; 62/3.2, 3.6, 3.3; 136/203, 205; 252/70

[56] References Cited

U.S. PATENT DOCUMENTS

| | | | |
|---|---|---|---|
| 3,400,452 | 9/1968 | Emley | 136/203 X |
| 3,441,449 | 4/1969 | Green | 62/3.2 X |
| 4,459,428 | 7/1984 | Chou | 136/205 X |
| 4,626,612 | 12/1986 | Brotz | 136/205 X |
| 4,681,981 | 7/1987 | Brotz | 136/205 |

FOREIGN PATENT DOCUMENTS

| | | |
|---|---|---|
| 0122121 | 10/1984 | European Pat. Off. . |
| 61-65487 | 4/1986 | Japan . |
| 62-287678 | 12/1987 | Japan . |
| 63-128681 | 6/1988 | Japan . |
| 64-002380 | 1/1989 | Japan . |
| 2-21675 | 1/1990 | Japan . |
| 2-71568 | 3/1990 | Japan . |
| 2-106079 | 4/1990 | Japan . |

OTHER PUBLICATIONS

Patent Abstracts of Japan, vol. 13, No. 173 (E 748), 24 Apr. 1989, p. 1/1.

*Primary Examiner*—William Mintel
*Attorney, Agent, or Firm*—Wenderoth, Lind & Ponack

[57] ABSTRACT

A thermoelectric semiconductor device having a porous structure and an air-tight sealing structure maintaining it in a deaerated state is disclosed. A refrigeration panel comprising a plurality of p-type and n-type semiconductor elements each having a structure mentioned above, in which the elements are arranged alternatively and electrically connected in series is also disclosed.

22 Claims, 9 Drawing Sheets

THERMOELECTRIC SEMICONDUCTOR HAVING A POROUS STRUCTURE DEAERATED IN A VACUUM AND THERMOELECTRIC PANEL USING P-TYPE AND N-TYPE THERMOELECTRIC SEMICONDUCTORS

Matter enclosed in heavy brackets [ ] appears in the original patent but forms no part of this reissue specification; matter printed in italics indicates the additions made by reissue.

*This is a Reissue Application of U.S. Pat. No. 5,168,339, issued Dec. 1, 1992, which matured into a patent from Ser. No. 688,242, filed Apr. 22, 1991.*

BACKGROUND OF THE INVENTION

1. Field of the Invention

The present invention relates to a thermoelectric semiconductor and an electronic panel using a plurality of p-type and n-type thermoelectric semiconductors.

2. Description of the Prior Art

Recently, electronic devices such as electronic refrigeration, heating and thermoelectric power generation devices which utilize a Peltier effect and/or a Seeback effect have been in high demand for various uses, such as for the inhibition of freon due to the global atmospheric problem, the local refrigeration for electronic apparatuses, as small refrigerators used for dehumidification, and for the utilization of the waste heat and the like.

In a conventional electronic refrigeration panel, p-type and n-type semiconductor elements each made of a Bi-Te system single or polycrystalline solid material are arranged alternatively in a two-dimensional configuration and electrically connected in series using Cu plates as electrodes.

In a conventional thermoelectric device, polycrystalline sintered materials such as $Fe_2Si$ or the like is used and p-type and n-type semiconductor elements are jointed with each other directly.

It has been known that the heat absorption amount in respect to the consumed power at the refrigerating side of an electronic refrigeration panel is determined by the performance factor of the semiconductive material used and that the performance factor is represented by $Z=S^2\cdot\sigma/k$ using a Seebeck coefficient S, an electrical conductivity o and thermal conductivity k of the semiconductive material. As is apparent from the above equation, the semiconductive material therefor is preferably required to have a large Seebeck coefficient, a high electric conductivity $\sigma$ and a low thermal conductivity K. Further, a refrigerator of this type, is driven intermittently after reaching a predetermined refrigeration temperature. In such a case, it is required to have a high adiabatic property at the time when no voltage is applied thereto. In a thermoelectric power generation device, each semiconductor element is required to have a low thermal conductivity in order to maintain a temperature difference between the higher and lower temperature sides.

Further, in a semiconductive material such as Bi-Te system material, there have been proposed various techniques such that Sb and/or Se are added thereto to reduce the lattice vibration in a heat conduction and a polycrystalline solidified body with a controlled grain size is made without growing the single crystal from a molten state to lower the thermal conductivity thereof.

In an electronic refrigeration device, it is said that it is theoretically possible to obtain a temperature difference of about 60° C. between the higher and lower temperature sides in a Bi-Te system semiconductive material, but this generates problems, in that the lowest achievable temperature, at the lower temperature side, becomes higher due to an increase of the temperature at the higher temperature side, if the amount of heat radiation thereat is small. The thermal resistance between an ordinal radiation plate and an ambient atmosphere is about 0.0002 to 0.0005 $W/cm^2\cdot deg$ under a spontaneous cooling and about 0.0004 to 0.0002 $W/cm^2\cdot deg$ under a forcible air cooling and, accordingly, a temperature rise at the radiation side (higher temperature side) is a serious problem.

To solve this problem, in a conventional refrigeration panel, a plurality of p-type and n-type semiconductor elements are arranged alternatively in a rectangular configuration, but with a gap therebetween to give a cross section two or three times as large as the sum of their cross sections obtained when they are arranged in contact with each other. Also, a heat radiation plate having an area about ten times as large as the above sum of their cross sections and fins each having an area about 5 to 7 times as large as the above sum are provided to give a total radiation area about 100 to 200 times as large as the above sum. The heat radiation plate and fins are forcibly air-cooled by a fan or water cooled.

However, there is a strong demand to cool a large refrigeration panel to a low temperature without using a large radiation plate and forcible cooling. If such a demand is realized such devices will be widely used for the refrigeration panel of a large size and the wall of a cold reserving chamber.

Further, in a conventional structure, bedewings are apt to occur at the lower temperature side and disconnections are often caused at junctions between the element and the electrode by corrosion due to said bedewings.

SUMMARY OF THE INVENTION

An object of the present invention is to provide thermoelectric semiconductor elements suitable for use in an electronic refrigeration device and/or a thermoelectric power generation device.

Another object of the present invention is to provide an electronic refrigeration panel which is capable of being cooled to a low temperature even under conditions such that the radiation coefficient at the radiation side is small.

One more object of the present invention is to provide an electronic refrigeration panel having a long lifetime, even under circumferences in which bedewings are often caused.

In order to achieve these objects of the present invention, according to one aspect of the present invention, each thermoelectric semiconductor is made of a porous material or supported by support particles, each of which is gas permeable.

Preferably, it is sealed air-tightly and inside thereof is deaerated in a vacuum to enhance the adiabatic property thereof.

According to another aspect of the present invention, there is provided an electronic refrigeration panel comprising a plurality of p-type and n-type semiconductor elements arranged alternatively with a gap therebetween or in contact with each other via a porous insulation sheet therebetween and are electrically connected in series.

Each semiconductor element consists of a porous material or gas permeable support particles and a thermoelectric semiconductive material supported by said support particles. Preferably, it is maintained in a deaerated slate by an insulation layer and electrodes formed on the surfaces thereof.

Further, each semiconductor element may consist of a porous or gas-permeable support block made of an insulation material and a thermoelectric semiconductive layer formed on the outer surfaces of said support block.

According to a further aspect of the present invention, a pair of p-type and n-type semiconductor elements are used as a unit for constructing a thermoelectric panel.

In this case, each unit has an air-tight structure and each element thereof is kept in a deaerated state.

BRIEF DESCRIPTION OF THE DRAWINGS

These and other objects and features of the present invention will become clear from the following description taken in conjunction with the preferred embodiments thereof with reference to the accompanying drawings in which:

FIG. 9 is a perspective view of an assembly of semiconductor elements according to a tenth preferred embodiment of the present invention.

DETAILED DESCRIPTION OF THE PREFERRED EMBODIMENTS

First Preferred Embodiment

Figure 1:
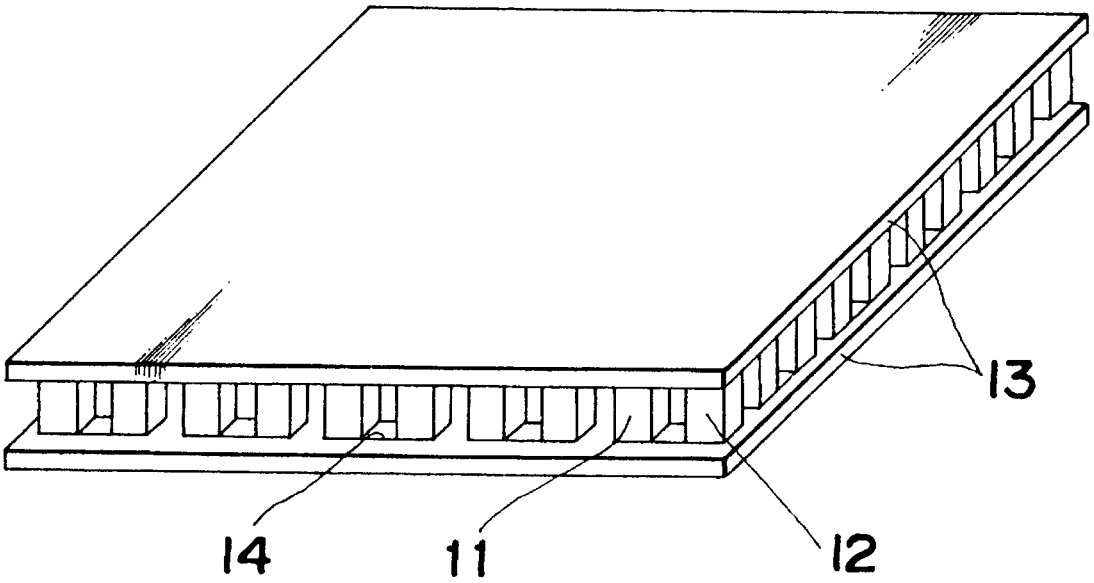
FIG. 1 is a view of a refrigeration panel according to a first preferred embodiment of the present invention.

FIG. 1 shows a thermoelectric refrigeration panel. The refrigeration panel is comprised of two rectangular alumina plates 13 and 13 and p-type and n-type semiconductor elements 11 and 12 arranged between said two alumina plates 13 and 13 in a matrix form of 15×15 regularly and alternatively. These semiconductor elements 11 and 12 are connected in series by elongated Ni plates 14. Each element is a cube of, for example, 1.5×1.5×1.5 $mm^3$.

As semiconductive materials for manufacturing these element, Bi-Te system materials are used. More concretely, $(Bi, Sb)_2Te_3$ and $Bi_2(Te, Se)_3$ are chosen.

In a manufacturing method therefor, after crushing polycrystalline solidified bodies of these materials as starting materials, they are milled into a powder by a ball mill using zirconia balls of a diameter of 2 mmϕ and a solvent of ethanol. After drying the powder, it is filled in a tube of platinum and sealed therein after deaeration thereof, and subjected to an HIP treatment at 500° C. and under a pressure of 10 to 1000 $Kg/cm^2$.

The sample thus formed is taken out from the tube and cut into pieces of 3 mm×3 mm×20 mm. The bulk density of the sample was measured at a room temperature and the porosity thereof was determined. The Seebeck coefficient thereof was also determined by measuring an electromotive force and temperatures at both ends of each piece while giving a temperature difference of 5° C. between both ends thereof at a room temperature. Further, the electric conductivity thereof was determined by measuring the resistance of the piece by the four terminal method while maintaining the same at a room temperature. Also, the performance factor Z of the piece was measured according to the Harmer method while hanging both ends of the piece with conductive wires of 0.07 mmϕ in a vacuum at a room temperature and the thermal conductivity was determined from the electric conductivity and Seebeck coefficient.

Table 1 indicates the porosity, electric conductivity, Seebeck coefficient, thermal conductivity and performance factor of the p-type semiconductor element 11 and Table 2 indicates those of the n-type semiconductor element 12.

Further, by measuring the thermal conduction between the upper and lower alumina plates 13, the thermal conductivity of the panel per unit area was determined.

Table 3 indicates the porosity of the semiconductor element and the thermal conductivity of the panel.

TABLE 1

| Sample No. | Porosity Vol % | Electric conductivity $10^{-3}$ Ω cm | Thermal conductivity W/cm · deg | Seebeck coefficient μV/deg | Performance factor $10^{-3}$/deg |
|---|---|---|---|---|---|
| *11 | 0 | 1.37 | 0.014 | 171 | 2.86 |
| 12 | 1.5 | 1.35 | 0.0138 | 171 | 2.86 |
| 13 | 5 | 1.33 | 0.0132 | 172 | 2.98 |
| 14 | 10 | 1.28 | 0.0125 | 170 | 2.96 |
| 15 | 30 | 0.92 | 0.0092 | 168 | 2.82 |
| 16 | 50 | 0.68 | 0.0072 | 165 | 2.57 |

*indicates a comparison example not included in the present invention.

TABLE 2

| Sample No. | Porosity Vol % | Electric conductivity $10^{-3}$ Ω cm | Thermal conductivity W/cm · deg | Seebeck coefficient μV/deg | Performance factor $10^{-3}$/deg |
|---|---|---|---|---|---|
| *17 | 0 | 1.16 | 0.0151 | −192 | 2.83 |
| 18 | 1.5 | 1.15 | 0.0150 | −191 | 2.80 |
| 19 | 5 | 1.12 | 0.0142 | −192 | 2.91 |

TABLE 2-continued

| Sample No. | Porosity Vol % | Electric conductivity $10^{-3}$ Ω cm | Thermal conductivity W/cm · deg | Seebeck coefficient μV/deg | Performance factor $10^{-3}$/deg |
|---|---|---|---|---|---|
| 20 | 10 | 1.07 | 0.0132 | −188 | 2.87 |
| 21 | 30 | 0.76 | 0.0099 | −179 | 2.46 |
| 22 | 50 | 0.59 | 0.0076 | −175 | 2.38 |

*indicates a comparison example not included in the present invention

TABLE 3

| Sample No. | Porosity | Thermal conductivity |
|---|---|---|
| *23 | 0 | 0.0372 |
| 24 | 1.5 | 0.0367 |
| 25 | 5 | 0.0354 |
| 26 | 10 | 0.0335 |
| 27 | 30 | 0.0268 |
| 28 | 50 | 0.0207 |

*indicates a comparison example wherein polycrystalline solidified bodies were used for the semiconductor elements.

As is apparent from Tables 1 to 3, the semiconductor having pores therein has a lower thermal conductivity and that of the refrigeration panel using the same is also low. Further, it is to be noted that the performance factor of the semiconductor having a porosity higher than 5% does not become so low, though the thermal conductivity thereof is much lowered.

Second Preferred Embodiment

Figure 2:
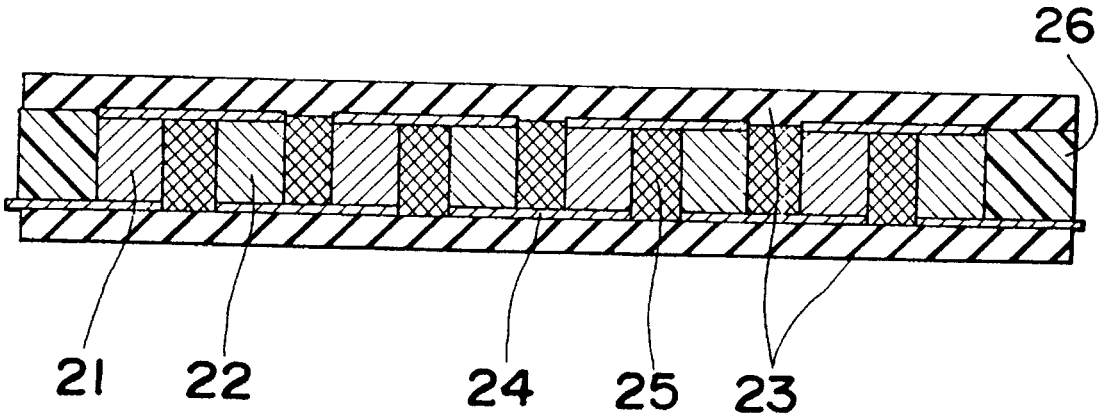
FIG. 2 is a cross-sectional view of a refrigeration panel according to a second preferred embodiment of the present invention.

FIG. 2 is a schematic cross-sectional view of a thermoelectrical refrigeration panel according to a second preferred embodiment of the present invention. This refrigeration panel has substantially the same structure as that shown in FIG. 1.

In this preferred embodiment, respective gaps between p-type and n-type semiconductor elements 21 and 22 arranged between two alumina plates 23 are filled with an adiabatic material 25, such as glass fibre having a bulk density of 0.04 g/cm$^2$ or powder of pearlite having an average diameter of 15 μm. Each side of the panel is sealed with an inorganic adhesive agent 26. A reference numeral 24 indicates an Ni plate connecting adjacent elements.

Semiconductor elements 21 and 22 are made of a semiconductive material having a porosity of 30%.

Table 4 shows respective thermal conductivities of the refrigeration panel.

TABLE 4

| Case No. | Composition | Thermal conductivity W/cm · deg |
|---|---|---|
| *23 | Porosity 0% gaps: not filled | 0.0372 |
| 29 | Porosity 30% gaps: not filled | 0.0268 |
| 30 | Porosity 0% gaps filled with glass fibre | 0.0361 |
| 31 | Porosity 30% gaps filled with glass fibre | 0.0254 |
| 32 | Porosity 0% gaps filled with pearlite powder | 0.0357 |
| 33 | Porosity 30% gaps filled with pearlite powder | 0.0251 |

As is easily understood from Table 4, the thermal conductivity of the refrigeration panel can be lowered in the case that gaps are filled with an inorganic porous material or powder, since no thermal conduction due to a neumatic convection flow occurs therein.

Also, it is to be noted that the thermal conductivity of the refrigeration panel using porous semiconductor elements is smaller than that using non-porous semiconductor elements.

Third Preferred Embodiment

Figure 3:
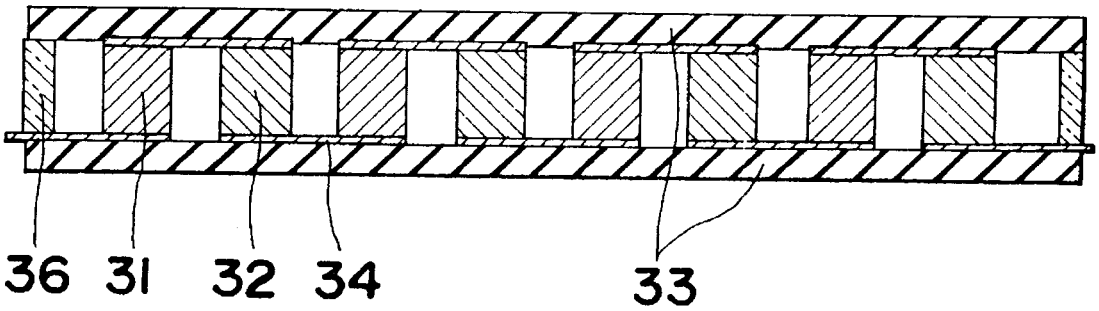
FIG. 3 is a cross-sectional view of a refrigeration panel according to a third preferred embodiment of the present invention.

FIG. 3 shows a schematic cross-sectional view of a thermoelectric refrigeration panel according to a third preferred embodiment of the present invention. The refrigeration panel has a structure substantially the same as that of the refrigeration panel shown in FIG. 2. Namely, p-type and n-type semiconductor elements 31 and 32 are regularly arranged between alumina plates 33 and connected in series by Ni plates 34.

Instead of filling gaps with an adiabatic material, the inner space of the panel is evacuated to a vacuum of about 0.001 mmHg by heating the panel so as to melt a sealing glass 36 arranged around the periphery thereof and then cooling the same.

Table 5 shows respective thermal conductivities of the refrigeration panels.

TABLE 5

| Case No. | Composition | Thermal conductivity W/cm · deg |
|---|---|---|
| *23 | Porosity 0% gaps filled with air | 0.0372 |
| 34 | Porosity 30% gaps filled with air | 0.0268 |
| 35 | Porosity 0% gaps in a vacuum | 0.0351 |
| 36 | Porosity 30% gaps in a vacuum | 0.0233 |

As is apparent from Table 5, the refrigeration panels wherein the inner space thereof is kept in a vacuum exhibit small thermal conductivities since no heat conduction due to a neumatic convection flow occurs therein.

The third preferred embodiment is advantageous in that it is possible to prevent connecting portions between the element and the Ni plate from corrosion and deterioration since no dew condensation occurs in a vacuum.

Fourth Preferred Embodiment

Figure 4:
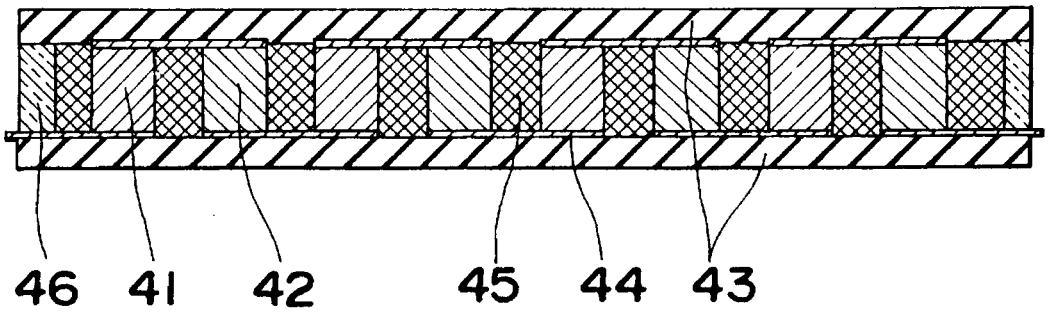
FIG. 4 is a cross-sectional view of a refrigeration panel according to a forth preferred embodiment of the present invention.

FIG. 4 shows a cross-sectional view of a thermoelectrical refrigeration panel according to a fourth preferred embodiment of the present invention.

In this preferred embodiment, gaps between p-type and n-type semiconductor elements 41 and 42 arranged between two alumina plates 43 and connected by Ni plates 44 are filled with an inorganic adiabatic material 45 such as glass fibre having a bulk density of 0.04 g/cm$^3$ or pearlite powder having an average grain size of 15 μm and the inside thereof is kept in an evacuated state to 0.01 mmHg by a glass sealing 46 according to a method similar to that of the third preferred embodiment.

Figure 5:
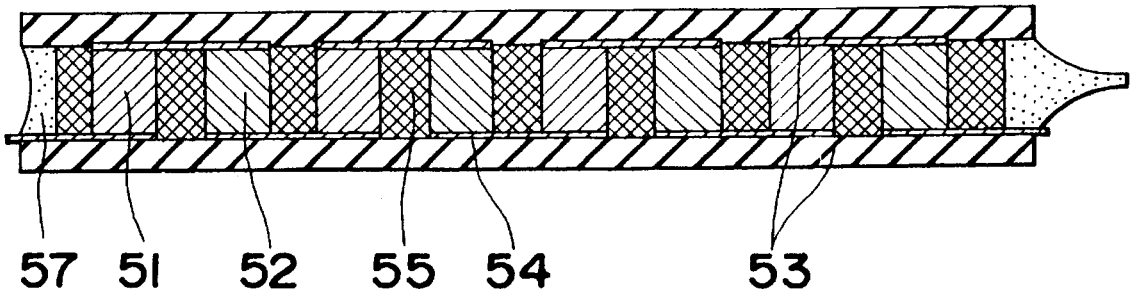
FIG. 5 is a cross-sectional view showing a variation of the fourth preferred embodiment of the present invention.

FIG. 5 shows a variation of FIG. 4 in which n-type elements 51 and 52 are arranged between two aluminum plates 53 and connected by Ni plates 54, and filled with an inorganic material 55 and sealed with a sealing material and wherein the insides thereof are maintained in an evacuated state, similar to FIG. 4.

In this variation, the inner side of the refrigeration panel is deaerated to a vacuum of about 1 mmHg after sealing the periphery thereof with a resin layer of about 1 mm thickness and, thereafter, sealed air-tightly.

Table 6 shows the thermal conductivity per unit area with respect to refrigeration panels prepared according to the fourth preferred embodiment together with a comparison example.

TABLE 6

| | Composition | | | Thermal |
|---|---|---|---|---|
| Case No. | porosity | filling material | sealing state | conductivity W/cm · deg |
| *23 | 0% | no (air) | | 0.0372 |
| 37 | 30% | no (air) | | 0.0268 |
| 38 | 0% | glass fibre | glass seal 0.01 mmHg | 0.0351 |
| 39 | 30% | glass fibre | glass seal 0.01 mmHg | 0.0235 |
| 40 | 0% | pearlite powder | glass seal 0.01 mmHg | 0.0352 |
| 41 | 30% | pearlite powder | glass seal 0.01 mmHg | 0.0235 |
| 42 | 0% | pearlite powder | resin seal 1.00 mmHg | 0.0352 |
| 43 | 30% | pearlite powder | resin seal 1.00 mmHg | 0.0240 |
| 44 | 0% | no (air) | resin seal 1.00 mmHg | 0.0364 |
| 45 | 30% | no (air) | resin seal 1.00 mmHg | 0.0260 |

As is apparent from Table 6, the fourth preferred embodiment can enjoy advantages similar to those obtained in the second and third preferred embodiments.

Fifth Preferred Embodiment

Figure 6:
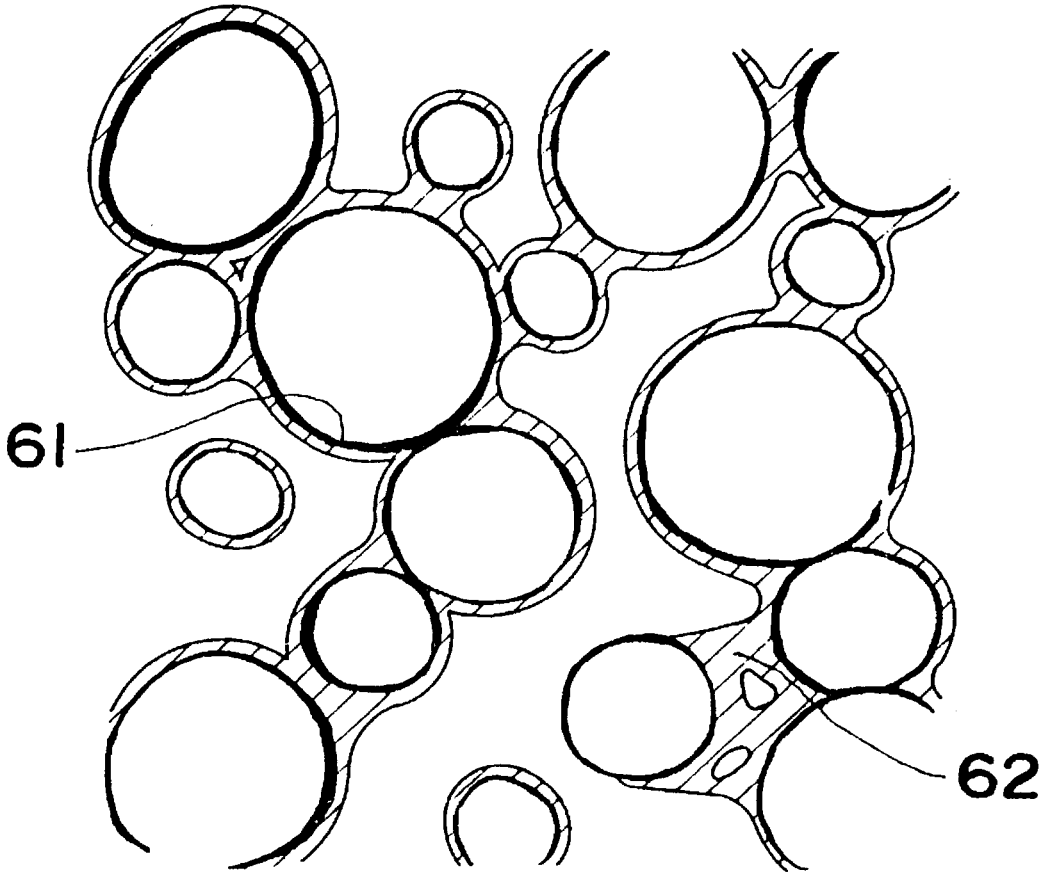
FIG. 6 is an enlarged partial cross-sectional view showing a texture of a semiconductive material according to a fifth preferred embodiment of the present invention.

FIG. 6 shows an enlarged schematic cross-sectional view of a thermoelectric semiconductor which is desirably available to semiconductor elements of the refrigerator panel.

$(Bi, Sb)_2Te_3$ and $Bi_2(Te, Se)_3$ are used for p-type and n-type semiconductive materials and a glass balloon material having an average particle size of 8 μm and a film thickness of 0.5 μm is used as support particles. Each glass balloon 61 is hollow but is not air-tight. Therefore, glass balloons 61 form a porous material. After crushing a solidified polycrystalline semiconductive material of p-type or n-type as a starting material, it is milled into a powder having an average particle size of 0.08 μm by a ball mill using zirconia balls of 2 mmϕ and an organic solvent. After drying the powder, it is mixed with a suitable viscous solvent to make a slurry. Then, the glass balloon material is mixed into the slurry and the mixture is dried. By repeating the mixing into the slurry and drying the mixture, the thickness of the semiconductive layer 62 supported by each glass balloon 61 can be varied.

The dried mixture is molded into cubic semiconductor elements and they are subjected to a heat treatment for two hours at 500° C. in argon gas.

The p-type and n-type semiconductor elements are submerged into a slurry after applying an insulation resin on the side surfaces of each element and, then, dried repeatedly. Then, these p-type and n-type semiconductor elements are arranged alternatively and in contact with each other to form a rectangle and, thereafter, the insulation resin is hardened to join them to each other. Further, they are connected in series by Ni plates.

For comparison, semiconductor elements made of a solid semiconductive material are also prepared.

In order to measure the temperature properties of individual refrigeration panels, a Cu plate of a thickness of 0.3 mm is adhered to the lower temperature side of each panel after applying an insulation grease and a thermocouple is adhered onto the Cu plate.

At the higher temperature side of each panel, a heat radiation plate is mounted after applying an insulation grease and a thermocouple is adhered to the heat radiation plate.

As the heat radiation plate, the following three plates were prepared to measure the temperature properties of the panel:

Type 1 [Heat Radiation Condition(1)]

A Cu heat radiation plate of a thickness of 0.5 mm having a heat radiation area same as the cross-section of the joined semiconductor elements and the surface of which is oxidized. Cooling condition is by spontaneous radiation.

Type 2 [Heat Radiation Condition (2)]

A Cu heat radiation plate of a thickness of 0.5 mm having a size equal to the cross-section of the joined semiconductor elements on which Cu radiation fins are planted at a pitch of 7 mm. Each radiation fin has a thickness of 0.3 mm and a width of 7 mm. The total heat radiation area is three times as large as that of the sole Cu heat radiation plate. Surfaces of the Cu heat radiation plate and fins are oxidized.

The cooling procedure is by spontaneous radiation.

Type 3 [Heat Radiation Condition (3)]

A Cu heat radiation plate of a thickness of 0.5 mm having a size four times as large as that-of Type 1 or 2 Cu heat radiation plate on which Cu radiation fins each having a thickness of 0.3 mm and a width of 7 mm are planted at a pitch of 5 mm. The total heat radiation area is twenty times as large as that of the cross-section of the joined semiconductor elements. The surface of the Cu heat radiation plate and fins are oxidized.

The cooling procedure is by spontaneous radiation.

There was sought a condition in which the temperature of the Cu plate at the lower temperature side becomes lowest by varying the current amount of a DC power source under heat radiation conditions (1), (2) and (3), respectively. The measurement was done at a room temperature of 300 K.

Table 7 shows the volume percentage a (%) of each thermoelectric semiconductor material, the volume percentage b (%) of the pore, the apparent resistivity c (Ωcm) of the semiconductor element (a, b and c are mean values averaged with respect to p-type and n-type semiconductor elements), the lowest achievable temperature d (K.) at the of the heat radiation fin at the time when the lowest achievable temperature was realized and the current quantity f (A) at that time.

TABLE 7-1

[Cooling condition (1)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *46 | 100 | 0 | 0.0010 | 300.0 | 300.0 | 0.0 |
| 47 | 72.5 | 22 | 0.0015 | 299.8 | 301.8 | 0.2 |
| 48 | 51.3 | 43.6 | 0.0021 | 299.3 | 302.3 | 0.5 |
| 49 | 27.9 | 67.3 | 0.0045 | 298.7 | 304.4 | 0.5 |
| 50 | 5.2 | 90.6 | 0.0250 | 295.0 | 314.5 | 0.4 |
| 51 | 1.8 | 93.2 | 0.1020 | 290.7 | 330.8 | 0.3 |

*indicates a comparison example not included in the present invention wherein elements of a semiconductive material have no pores therein.

TABLE 7-2

[Cooling condition (2)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *52 | 100 | 0 | 0.0010 | 298.6 | 301.5 | 1.0 |
| 53 | 72.5 | 22 | 0.0015 | 298.0 | 301.8 | 1.5 |
| 54 | 51.3 | 43.6 | 0.0021 | 297.1 | 305.7 | 1.5 |
| 55 | 27.9 | 67.3 | 0.0045 | 294.6 | 308.2 | 1.3 |
| 56 | 5.2 | 90.6 | 0.0250 | 284.5 | 323.7 | 1.0 |
| 51 | 1.8 | 93.2 | 0.1020 | 283.9 | 319.7 | 0.4 |

*indicates a comparison example not included in the present invention wherein elements of a semiconductive material have no pores therein.

TABLE 7-3

[Cooling condition (3)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *58 | 100 | 0 | 0.0010 | 289.1 | 310.3 | 8.3 |
| 59 | 72.5 | 22 | 0.0015 | 287.6 | 312.2 | 7.8 |
| 60 | 51.3 | 43.6 | 0.0021 | 281.8 | 315.4 | 7.2 |
| 61 | 27.9 | 67.3 | 0.0045 | 273.1 | 320.0 | 5.8 |
| 62 | 5.2 | 90.6 | 0.0250 | 263.9 | 313.2 | 2.2 |
| 63 | 1.8 | 93.2 | 0.1020 | 279.0 | 304.3 | 0.5 |

*indicates a comparison example not included in the present invention wherein elements of a semiconductive material have no pores therein.

As is apparent from Table 7, semiconductor elements made of a semiconductive material comprised of glass balloon supports and a semiconductive layer supported thereby is able to make the lowest achievable temperature, reasonably lower than that of the semiconductors with no pores therein.

Sixth Preferred Embodiment $(Bi, Sb)_2Te_3$ and $SrTiO_{3-x}$ are used for p-type and n-type semiconductive materials, respectively, and foam alumina balloons having a mean particle size or 1 mm, a porosity of 95% and a mean pore size of 4 μm are used as support particles for the semiconductive material in a sixth preferred embodiment.

A solidified polycrystalline mass of $(Bi, Sb)_2Te_3$ and a sintered mass of $SrTiO_{3-x}$ as starting materials are crushed separately and each material is milled into a powder having a mean grain size of 0.08 μm by a ball mill using zirconia balls of 0.2 mmϕ and an organic solvent. After drying the same, it is mixed with a viscous solvent to make a slurry having a density in which the semiconductive material is adhered to the surfaces of the alumina balloons. Then, the mixture in the state of a slurry is dried.

The thickness of the semiconductor layer can be increased by repeating the mixing process and drying process, After drying the material obtained, the same is subjected to a heat treatment for two hours at a temperature of 500° C. in a argon atmosphere.

Figure 7:
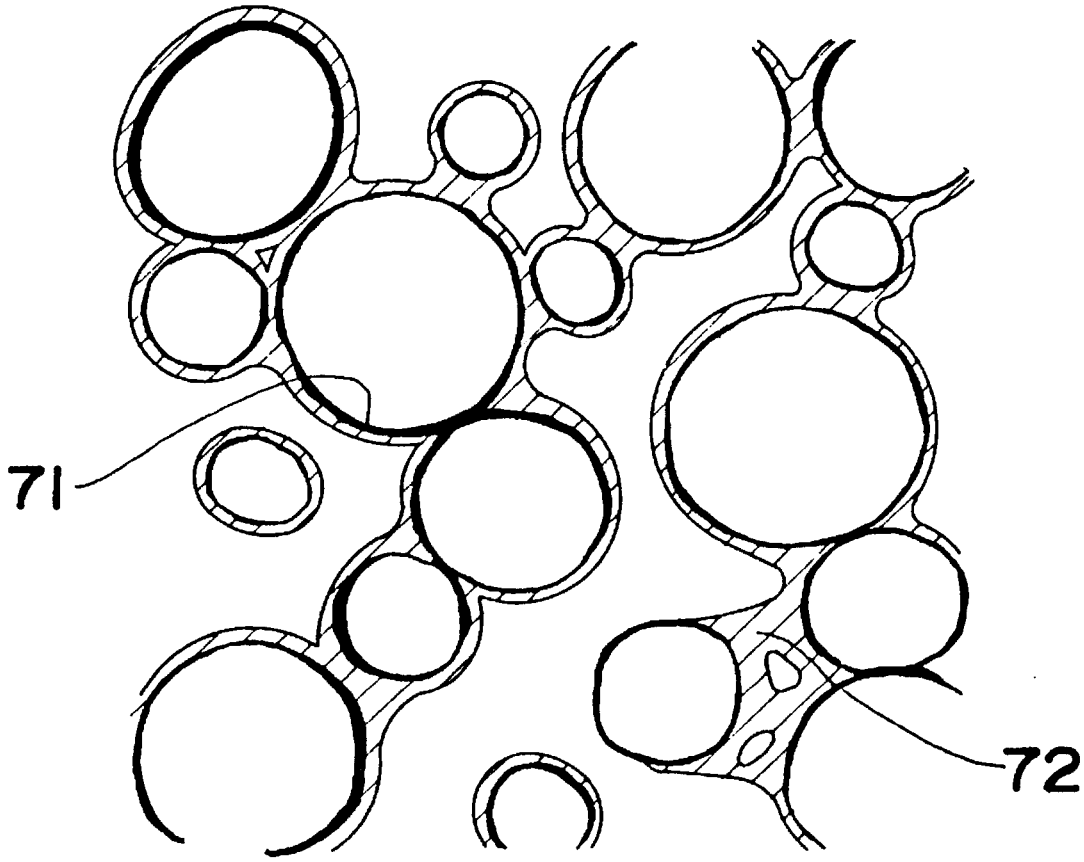
FIG. 7 is an enlarged partial cross-sectional view showing a texture of a semiconductive material according to a sixth preferred embodiment of the present invention.

FIG. 7 shows an enlarged schematic cross-sectional view of a semiconductor obtained according to the manufacturing process mentioned above.

As shown in FIG. 7, the semiconductor is composed of alumina balloons 71 and a thermoelectric semiconductor layer 72.

After forming semiconductor elements in the configuration of a cube, they are assembled so as to constitute a refrigeration panel by a method similar to that stated in the fifth preferred embodiment and the physical quantities same as those cited in Table 7 were measured under the same cooling conditions (1), (2) and (3) as those of the fifth preferred embodiment.

Table 8 shows the results of the measurement.

TABLE 8-1

[Cooling condition (1)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *64 | 100 | 0 | 0.0010 | 300.0 | 300.0 | 0.0 |
| 65 | 54.6 | 38.3 | 0.0025 | 299.6 | 301.8 | 0.5 |
| 66 | 33.3 | 60.6 | 0.0034 | 299.5 | 301.4 | 0.3 |
| 67 | 15.3 | 77.9 | 0.0073 | 298.8 | 304.2 | 0.4 |
| 68 | 8.3 | 86.0 | 0.0125 | 298.1 | 305.1 | 0.3 |
| 69 | 1.4 | 90.6 | 0.1250 | 294.3 | 318.3 | 0.2 |

*indicates a comparison example not included in the present invention wherein elements of a semiconductive material have no pores therein.

TABLE 8-2

[Cooling condition (2)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *70 | 100 | 0 | 0.0010 | 299.3 | 301.1 | 1.0 |
| 71 | 54.6 | 38.3 | 0.0025 | 298.5 | 302.3 | 1.2 |
| 72 | 33.3 | 60.6 | 0.0034 | 297.9 | 303.4 | 1.3 |
| 73 | 15.3 | 77.9 | 0.0073 | 295.7 | 307.5 | 1.0 |
| 74 | 8.3 | 86.0 | 0.0125 | 293.2 | 310.2 | 0.8 |
| 75 | 1.4 | 90.6 | 0.1250 | 289.1 | 313.9 | 0.4 |

*indicates a comparison example not included in the present invention wherein elements of a semiconductive material have no pores therein.

TABLE 8-3

[Cooling condition (3)]

| Case No. | Volume % of Semi-con. a (%) | Volume % of pore b (%) | Resis-tivity c (Ω cm) | Lowest achiev Temp. d (K.) | Temp. at radiat side e (K.) | Current amount f (A) |
|---|---|---|---|---|---|---|
| *76 | 100 | 0 | 0.0010 | 294.4 | 305.0 | 6.3 |
| 77 | 54.6 | 38.3 | 0.0025 | 290.3 | 303.3 | 5.5 |
| 78 | 33.3 | 60.6 | 0.0034 | 287.2 | 310.2 | 5.0 |
| 79 | 15.3 | 77.9 | 0.0073 | 278.8 | 312.4 | 3.2 |
| 80 | 8.3 | 86.0 | 0.0125 | 277.0 | 311.1 | 2.5 |
| 81 | 1.4 | 90.6 | 0.1250 | 284.4 | 303.5 | 0.4 |

*indicates a comparison example not included in the present invention wherein elements of a semiconductive material have no pores therein As is apparent from Table 8, cases in that the porous semiconductor elements are used can make the lowest achievable temperature much lower than that of the case using the solid semiconductor elements. This effect is enhanced under the cooling conditions (1), (2) and (3) mentioned above in each of which the heat radiation surface area per the cross-section of the semiconductor element is small and the cooling is by spontaneous radiation having a radiation efficiency lower than that of an ordinary electronic refrigeration device.

Seventh Preferred Embodiment

In this preferred embodiment, $(Bi, Sb)_2Te_3$ and $Bi_2(\ )Te, Se)_3$ are also used for p-type and n-type semiconductive materials and, as support particles, a glass balloon material having a mean particle size of 500 μm and a shell thickness of 1.5 μm. The glass balloon material has a hollow structure and the structure of porous pellets having a mean pore size of 25 μm partially. Since the glass material itself is porous, the glass balloon material forms a porous material.

After crushing a solidified polycrystalline semiconductive material of p-type or n-type as a starting material, it is milled into a powder having a mean particle size of 0.08 μm by a ball mill using zirconia balls of 0.2 mmϕ and an organic solvent. After drying the powder, it is mixed into a suitable viscous solvent to make a slurry. By repeating the mixing into the slurry and drying the mixture, the thickness of the semiconductive layer supported by the glass balloon material can be varied.

The dried mixture is molded into cubic semiconductor elements and they are subjected to a heat treatment for two hours at 500° C. in argon atmosphere.

The p-type and/or n-type semiconductor element thus manufactured has a volume percentage of 5.3%, a porosity of 90.6%, a resistivity of 0.0250 Ωcm and a Seebeck coefficient of 200 μV/deg.

Figure 8:
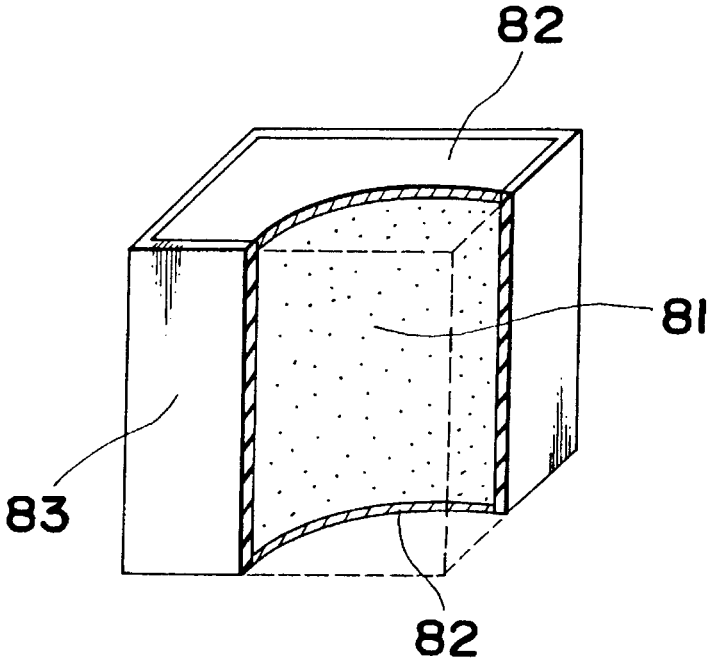
FIG. 8 is an enlarged perspective view of a semiconductor element partially cut according to a seventh preferred embodiment of the present invention.

FIG. 8 is an enlarged perspective view of a semiconductor element partially cut off according to the seventh preferred embodiment.

Each cubic semiconductor element 81 is subjected to an Ni electrolytic plating treatment to form electrodes on the upper and bottom surfaces thereof and, thereafter, Cu plates 82 are adhered to respective plated surfaces to form upper and lower electrodes 82. Further, an air-tight insulation resin 83 of an ultraviolet curing type is coated on the side surfaces thereof in a vacuum and is cured by irradiation of ultraviolet rays.

The p-type and n-type semiconductor elements are alternatively arranged in a rectangle with no gaps and fixed, using a suitable bonding agent, with each other to form the main body of a refrigeration panel. Thereafter, they are connected in series using Ni plates.

On the lower temperature side of the refrigeration panel, an insulation grease is applied thinly and a Cu plate of a thickness of 0.3 mm is bonded. On the Cu plate, a thermocouple is mounted to measure the thermal properties. On the higher temperature side thereof, an insulation grease is coated and a heat radiation plate having a thickness of 0.5 mm is adhered. The heat radiation plate has a size four times as large as the cross-section of the main body comprised of the semiconductor elements. This radiation plate provides with Cu radiation fins planted thereof at a pitch of 5 mm each of which has a thickness of 0.3 mm and a width of 10 mm. A thermocouple is mounted on the heat radiation plate to measure the thermal properties of the refrigeration panel. The cooling is by spontaneous radiation. The measurement was made at an ambient temperature of 300 K. to find a condition under which the lowest achievable temperature is obtained at the lower temperature side, while varying the current amount of an electric power source.

Since it is possible to cool the lower temperature side of the panel down to about 0° C. in the cases in that the porous semiconductor elements are used, bedewing usually occurs. Therefore, bedewing was caused repeatedly by applying an electric current for 20 minutes every two hours to measure the variations of the various physical quantities.

Table 9 shows each compositional condition of each sample tested, the lowest achievable temperature at the lower temperature side thereof, the temperature of the fin at a time when the lowest achievable temperature is obtained, the amount of current at that time and the number of repetitions of bedewing at which detorioration was observed.

TABLE 9

| Case No. | State of sample | L.A. Temp. | Temp. of fin | Current amount | Number of times of repetition |
|---|---|---|---|---|---|
| *82 | solid semiconductor elements | 288.3 K. | 310.3 K. | 8.3 A | |
| *83 | porous semiconductor but not air-tight | 263.9 K. | 313.2 K. | 2.2 A | 138 |
| 84 | porous semiconductor air-tight at 50 Pa | 259.2 K. | 314.6 K. | 2.2 A | over 500 times |
| 85 | porous semiconductor air-tight at 100 Pa | 259.5 K. | 314.7 K. | 2.2 A | over 500 times |
| *86 | porous semiconductor air-tight at 1.000 Pa | 263.5 K. | 313.2 K. | 2.2 A | over 500 times |
| *87 | porous semiconductor air-tight at 10.000 Pa | 263.7 K. | 313.6 K. | 2.2 A | 413 |

*indicates a comparison example not included in the present invention

As is easily understood from Table 9, when porous semiconductor elements are used, the lowest achievable temperature at the lower temperature side can be lowered in comparison with the case in which solid semiconductor elements are employed. But, detorioration due to the bedewing may be caused in a case of the porous semiconductor element. Further, if semiconductor elements, deaerated individually, were used as in the present preferred embodiment, the lowest achievable temperature could be lowered further and a lifetime against deterioration due to the bedewing, could be very much lengthened.

The present preferred embodiment is advantageous especially under the cooling conditions mentioned above. Further, since each semiconductor element is formed to have an air-tight structure in the present preferred embodiment, it becomes possible to assemble the elements in an arbitrary configuration resulting in a wide use.

Eighth Preferred Embodiment

Figure 9:
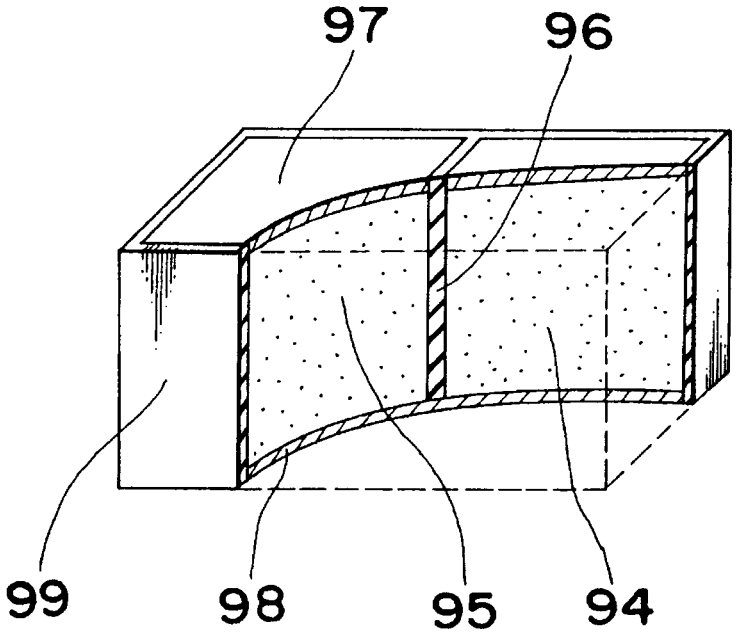
FIG. 9 is an enlarged perspective view of a unit of p-type and n-type semiconductor elements according to an eighth preferred embodiment of the present invention.

FIG. 9 is an enlarged perspective view of a unit comprised of a pair of p-type and n-type semiconductor elements 94 and 95.

These semiconductor elements 94 and 95 are manufactured according to the same method as that of the first preferred embodiment. Between the pair of p-type and n-type semiconductor elements 94, an insulation film 96, such as a ceramic film is inserted and, on upper surfaces thereof, Cu electrode plates 97, are soldered respectively but insulated by the above insulation film 96. The lower surfaces of them are commonly connected by a common Cu electrode plate 98 of thickness of a 0.3 mm soldered thereon.

These units thus formed, are set in a vacuum chamber and an ultraviolet-curing resin is applied to all side surfaces of each unit therein. Thereafter, the resin is cured by irradiation of using ultraviolet rays. The cured resin layer 99 maintains each unit in an air-tight structure.

A predetermined number of the units are arranged so as to be able to connect them in series, joined tightly and connected in series using Ni plates. Two alumina plates are adhered on the upper and lower surfaces of the joined body of the units to form heat radiation surfaces similarly to the seventh preferred embodiment.

Measurements of respective physical quantities were carried out under the same conditions as those in the seventh preferred embodiment.

TABLE 10

| Case No. | State of sample | L.A. Temp | Temp. of fin | Current amount | Number of times of repetition |
|---|---|---|---|---|---|
| *88 | solid semiconductor elements | 288.3 K. | 310.3 K. | 8.3 A | |
| *89 | porous semiconductor but not air-tight | 263.9 K. | 313.2 K. | 2.2 A | 138 |
| 90 | porous semiconductor air-tight at 50 Pa | 258.3 K. | 314.6 K. | 2.2 A | over 500 times |
| 91 | porous semiconductor air-tight at 100 Pa | 256.2 K. | 314.7 K. | 2.2 A | over 500 times |
| *82 | porous semiconductor air-tight at 1.000 Pa | 263.8 K. | 314.1 K. | 2.2 A | over 500 times |
| *93 | porous semiconductor air-tight at 10.000 Pa | 263.6 K. | 314.6 K. | 2.2 A | over 500 times |

*indicates a comparison example not included in the present invention.

As is easily understood from Table 10, when porous semiconductor elements are used, the lowest achievable temperature at the lower temperature side can be lowered in comparison with the case using solid semiconductor elements.

Further, if semiconductor units deaerated individually were used as in the present preferred embodiment, the lowest achievable temperature could be lowered further and the lifetime against deterioration due to the bedewing can be lengthened considerably.

The present preferred embodiment is advantageous, especially under the cooling conditions mentioned above. The porous insulation film 96 inserted between the p-type and n-type semiconductor elements 94 and 95 serves to deaerate said two elements equally and to lower the thermal conductivity of the refrigeration panel.

Ninth Preferred Embodiment

Figure 10:
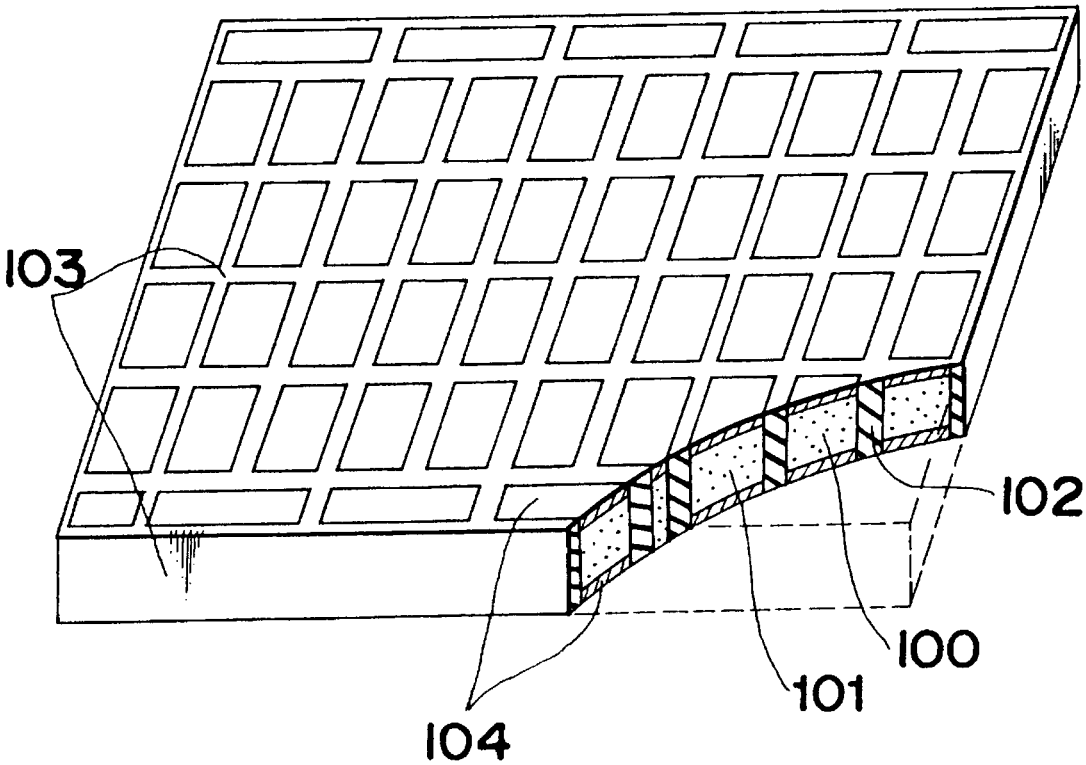
FIG. 10 is an enlarged perspective view of a semiconductor element according to an eleventh preferred embodiment of the present invention.

FIG. 10 shows a main body of a refrigeration panel according to a ninth preferred embodiment of the present invention.

Porous semiconductor elements 100 and 101 of p-type and n-type are manufactured using the same method as that of the seventh preferred embodiment.

After subjecting each element to Ni electrolytic plating to form Ni films on the upper and lower surfaces thereof, an insulation porous resin 102 is applied to the side surfaces thereof. Then, a predetermined number of p-type and n-type semiconductor elements are arranged alternatively in a contacted state.

By soldering a plurality of Cu plates 104 on the upper and lower surfaces of the assembled body, the semiconductor elements are electrically connected in series. Then, the assembled body is put into a vacuum chamber and an ultraviolet-curing air-tight insulation resin 103 is applied to all surfaces not covered by the Ni films therein. This resin is cured by irradiation of ultraviolet rays in a deaerated state.

Table 11 shows the physical quantities of each refrigeration panel measured under radiation conditions same as those of the seventh preferred embodiment of the present invention.

TABLE 11

| Case No. | State of sample | L.A. Temp. | Temp. of fin | Current amount | Number of times of repetition |
|---|---|---|---|---|---|
| *94 | solid semiconductor elements | 288.3 K. | 310.3 K. | 8.3 A | |
| *95 | porous semiconductor but not air-tight | 263.9 K. | 313.2 K. | 2.2 A | 138 |
| 96 | porous semiconductor air-tight at 50 Pa | 256.1 K. | 315.6 K. | 2.2 A | over 500 times |
| 97 | porous semiconductor air-tight at 100 Pa | 256.1 K. | 315.1 K. | 2.2 A | over 500 times |
| *98 | porous semiconductor | 263.3 K. | 314.0 K. | 2.2 A | 499 times |

TABLE 11-continued

| Case No. | State of sample | L.A. Temp. | Temp. of fin | Current amount | Number of times of repetition |
|---|---|---|---|---|---|
| | air-tight at 1.000 Pa | | | | |
| *99 | porous semiconductor air-tight at 10.000 Pa | 263.6 K. | 313.8 K. | 2.2 A | over 500 times |

*indicates a comparison example not included in the present invention.

As is apparent from Table 11, the present preferred embodiment can enjoy advantages substantially the same as those obtained by the seventh or eighth preferred embodiment.

In addition, according to the present preferred embodiment, since the semiconductor elements are deaerated in an assembled state, the deaeration process can be simplified and they can be deaerated uniformly.

Tenth Preferred Embodiment

Figure 11:
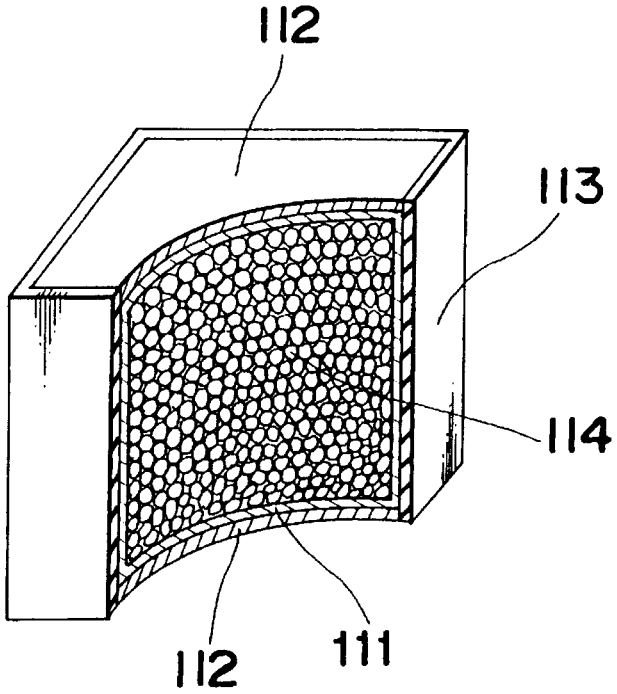
FIG. 11 is an enlarged perspective view of a unit of p-type and n-type semiconductor elements according to a twelfth preferred embodiment of the present invention.

FIG. 11 shows a semiconductor element according to a tenth preferred embodiment.

The semiconductor element is substantially comprised of a thermoelectric semiconductor layer 111 supported by alumina balloons 114. Thermoelectric semiconductive material used for p-type and n-type semiconductors are $(Bi, Sb)_2Te_3$ and $Bi_2(Te, Se)_3$, respectively. The alumina balloon 114 has a mean particle size of 200 μm and a shell thickness of 1.0 μm. This alumina balloon material is a partly hollow and a partly porous pellet having a pore size of 25 μm and shells forming balloons are porous. The alumina balloon material is formed into cubic support blocks after adding an organic binder and these blocks are burned at 1,400° C.

After crushing a solidified polycrystalline semiconductive material as the starting material, it is milled into a powder having a mean particle size of 0.08 μm by a ball mill using zirconia balls of 0.2 mmϕ and an organic solvent. After drying the powder, it is mixed with a viscous solvent to make a slurry. Thereafter, each support blocks are immersed into the slurry and, then, dried. The support blocks thus manufactured are subjected to a heat treatment for two hours at 500° C. in argon gas.

An area ratio of the semiconductive layer 111 to the support block 114 is 5.3%, the porosity thereof is 906%, the resistivity is 0.0250 Ωcm and the Seebeck coefficient is 200 μV/deg. The semiconductor layer 111 has many pores therein and, therefore, the semiconductor element has an air permeability as a whole.

After subjecting the upper and lower surfaces of each semiconductor element, Cu electrode plates 112 are soldered thereon. Further, an air-tight insulation resin 113 of ultraviolet-curing type is applied to all side surfaces thereof in a vacuum chamber and cured by irradiation of ultraviolet rays.

Predetermined number of p-type and n-type semiconductor elements are arranged alternatively so as to form a rectangle and are fixed by applying a bonding agent to the end faces of the assembled body. Further, they are connected in series using Ni plates.

After applying an insulation grease on the lower temperature side of the assembled body, a Cu plate of a thickness of 0.3 mm is adhered thereto and a thermocouple is mounted thereon to measure the temperature. A heat radiation plate is mounted on the higher temperature side thereof after applying an insulation grease thereon. A thermocouple is adhered on the heat radiation plate.

The heat radiation plate has an area four times as large as the cross-section of the assembled body and many Cu fins planted thereon at a pitch of 5 mm. Thicknesses of the heat radiation plate and fin are 0.5 mm and 0.3 mm, respectively. The width of the fin is 10 mm. The heat radiation plate including the fins has a radiation area twenty times as large as the cross-section of the assembled body. All radiation surfaces thereof have been oxidized. The radiation condition is spontaneous radiation.

The measurement was done at an ambient temperature or 300 K. to measure the lowest achievable temperature by varying the current amount of a DC power source.

Table 12 shows physical quantities the same as those shown in Table 11.

TABLE 12

| Case No. | State of sample | L.A. Temp. | Temp. of fin | Current amount | Number of times of repetition |
|---|---|---|---|---|---|
| *100 | solid semiconductor elements | 288.3 K. | 310.3 K. | 8.3 A | |
| *101 | porous semiconductor but not air-tight | 262.9 K. | 314.5 K. | 2.4 A | 259 |
| 102 | porous semiconductor air-tight at 50 Pa | 258.6 K. | 312.6 K. | 2.3 A | over 500 times |
| 103 | porous semiconductor air-tight at 100 Pa | 258.3 K. | 311.3 K. | 2.3 A | over 500 times |
| *104 | porous semiconductor air-tight at 1.000 Pa | 261.7 K. | 315.9 K. | 2.4 A | 413 times |
| *105 | porous semiconductor air-tight at 10.000 Pa | 262.0 K. | 314.9 K. | 2.8 A | 436 times |

*indicates a comparison example not included in the present invention

As is apparent from Table 2, according to the tenth preferred embodiment, the merits are substantially the same as those of the seventh preferred embodiment.

Eleventh Preferred Embodiment

Figure 12:
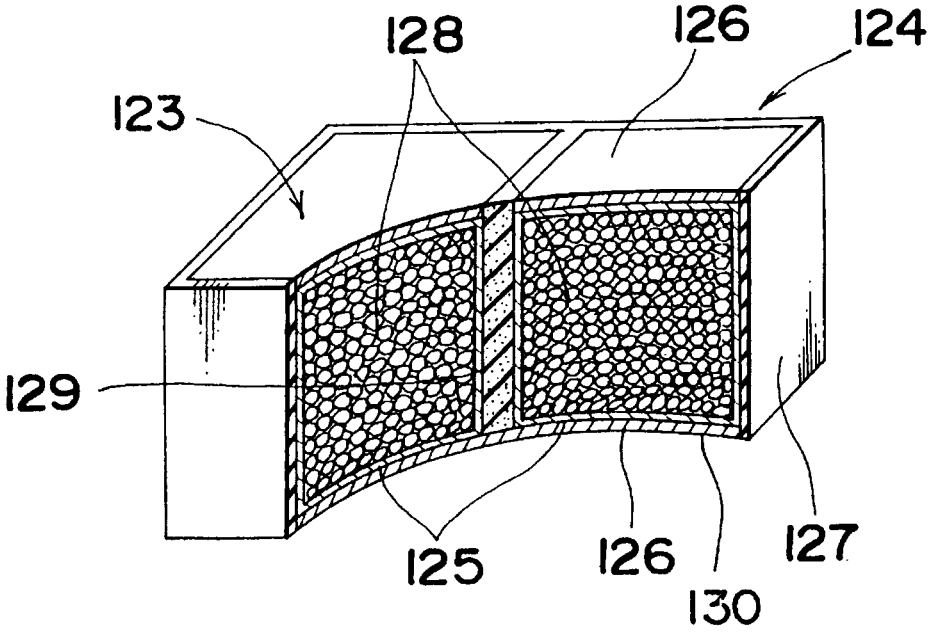
FIG. 12 is an enlarged partial perspective view of a refrigeration panel according to a thirteenth preferred embodiment of the present invention and FIG. 13 is a perspective view of a conventional refrigeration panel.

FIG. 12 shows an enlarged perspective view of a unit comprised of a pair of p-type and n-type semiconductor elements, each of which has a structure substantially same as that of the semiconductor element shown in FIG. 11.

Namely, this unit has a pair of p-type and n-type semiconductor elements 123 and 124 joined via a porous ceramic sheet 129 having a thickness of 200 μm. Each semiconductor element has a porous semiconductor layer 125 supported by a porous support 128 and a Cu plate 126 is soldered on the upper surface thereof. On the lower surface of the unit, a common electrode Cu plate 130 is soldered. The side surfaces of the unit are covered by an air-tight insulation resin 127.

The measurement was done under radiation conditions which are the same as those in the seventh preferred embodiment.

Table 13 shows physical quantities which are the same as those shown in Tables 9, 10, 11 or 12.

TABLE 13

| Case No. | State of sample | L.A. Temp. | Temp. of fin | Current amount | Number of times of repetition |
|---|---|---|---|---|---|
| *106 | solid semiconductor elements | 288.3 K. | 310.3 K. | 8.3 A | |
| *107 | porous semiconductor but not air-tight | 261.6 K. | 312.2 K. | 2.2 A | 312 |
| 108 | porous semiconductor air-tight at 50 Pa | 257.3 K. | 313.6 K. | 2.4 A | over 500 times |
| 109 | porous semiconductor air-tight at 100 Pa | 257.0 K. | 316.7 K. | 2.6 A | over 500 times |
| *110 | porous semiconductor air-tight at 1.000 Pa | 268.6 K. | 311.6 K. | 2.4 A | 439 times |
| *111 | porous semiconductor air-tight at 10.000 Pa | 268.6 K. | 311.6 K. | 2.4 A | 439 times |

*indicates a comparison example not included in the present invention.

According to this preferred embodiment, merits are obtained, which are substantially the same as those obtained by the eighth preferred embodiment.

Twelfth Preferred Embodiment

Figure 13:
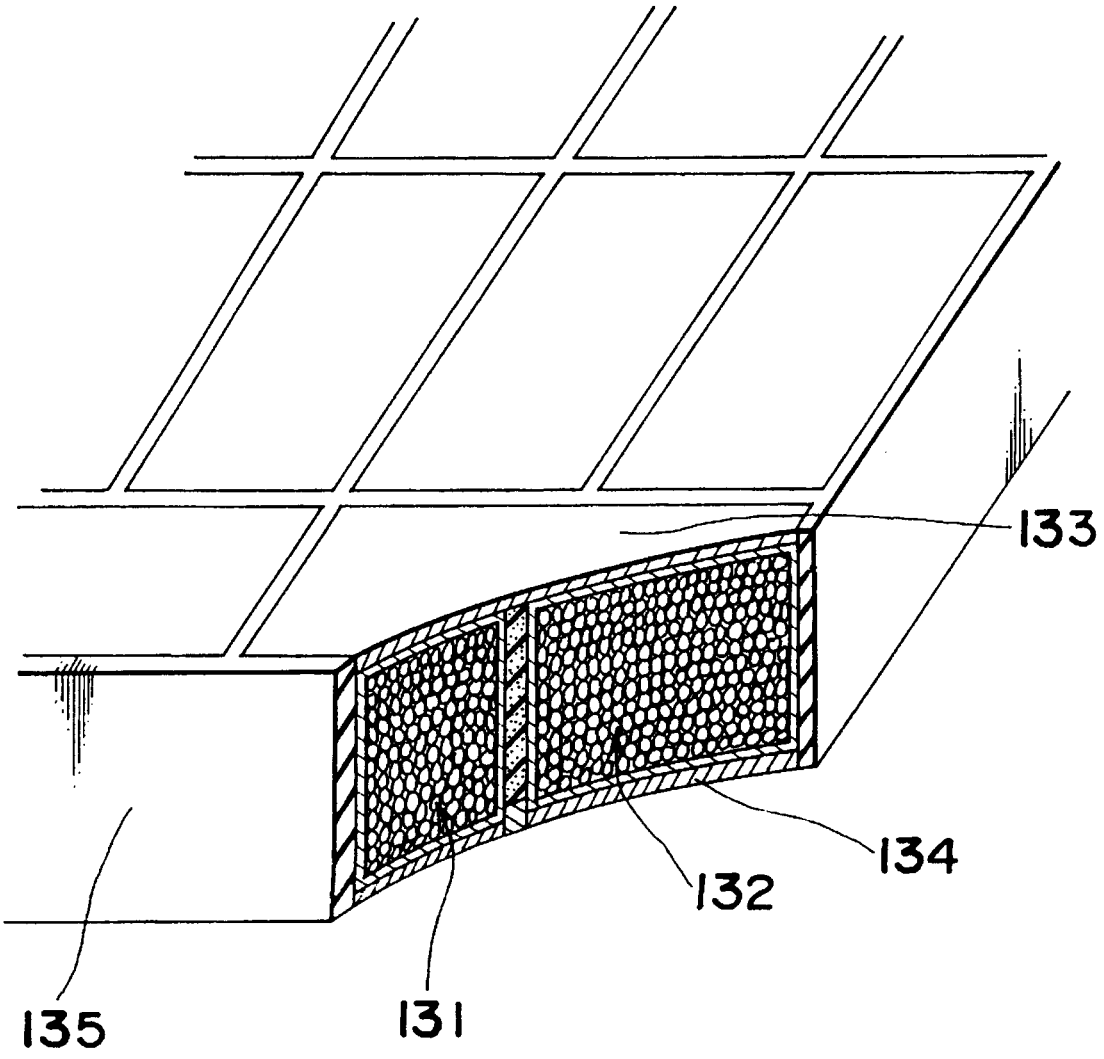

FIG. 13 shows a twelfth preferred embodiment of the present invention.

In this preferred embodiment, p-type and n-type semiconductor elements 131 and 132 each having a structure same as that of the tenth preferred embodiment are used and electrically connected in series using Cu electrode plates 133 and 134 in a manner similar to that shown in FIG. 10. Each Cu electrode plate has an area two times as large as that of one face of the semiconductor element so as to be able to connect a pair of the semiconductor elements in common.

Side surfaces of the assembled body and portions, not covered by Cu electrode plates 133 and 134, are covered by an air-tight insulation resin 135 similarly to FIG. 10.

Table 14 shows the physical quantities measured under radiation conditions which are the same as those in the tenth preferred embodiment.

TABLE 14

| Case No. | State of sample | L.A. Temp. | Temp. of fin | Current amount | Number of times of repetition |
|---|---|---|---|---|---|
| *112 | solid semiconductor elements | 288.3 K. | 310.3 K. | 8.3 A | |
| *113 | porous semiconductor but not air-tight | 263.6 K. | 310.2 K. | 2.8 A | 138 |
| 114 | porous semiconductor air-tight at 50 Pa | 254.6 K. | 314.6 K. | 2.7 A | over 500 times |
| 115 | porous semiconductor air-tight at 100 Pa | 259.6 K. | 313.9 K. | 2.7 A | over 500 times |
| *116 | porous semiconductor air-tight at 1.000 Pa | 264.3 K. | 315.9 K. | 2.6 A | over 499 times |
| *117 | porous semiconductor air-tight at 10.000 Pa | 264.8 K. | 316.3 K. | 2.7 A | over 500 times |

*indicates a comparison example not included in the present invention.

According to the twelfth preferred embodiment of the present invention, merits the same as those obtained by the tenth preferred embodiment can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims.

What is claimed is:

[1. A thermoelectric semiconductor device in which p-type and n-type thermoelectric semiconductor elements are electrically connected alternatively in series to form p-n junctions for causing energy conversions between thermal energy and electrical energy characterized in that each of said p-type and n-type thermoelectric semiconductor elements consists of a porous material.]

[2. The thermoelectric semiconductor device as claimed in claim 1 in which a volume percentage of pores to said semiconductor is 5% or more.]

[3. A thermoelectric semiconductor device in which a plurality or p-type and n-type thermoelectric semiconductor elements are arranged in a two-dimensional configuration and electrically connected alternatively in series to form p-n and junctions for causing energy conversions between thermal and electrical energy characterized in that said p-type and n-type thermoelectric semiconductor elements are porous materials arranged with a space between them and every space is filled with an adiabatic insulation inorganic porous powered material.]

4. A thermoelectric semiconductor device in which a plurality of p-type and n-type thermoelectric semiconductor elements are arranged in a two-dimensional configuration and electrically connected alternatively in series to form p-n junctions for causing energy conversions between thermal and electrical energy characterized in that spaces existing among said p-type and n-type semiconductor elements are deaerated into a vacuum.

5. A thermoelectric semiconductor device in which a plurality of p-type and n-type thermoelectric semiconductor elements are arranged in a two-dimensional configuration and electrically connected alternatively in series to form p-n junctions for causing energy conversions between thermal and electrical energy characterized in that spaces existing among said p-type and n-type semiconductor elements are filled with an inorganic insulation material and deaerated into a vacuum of 1 mmHg or less.

6. The thermoelectric semiconductor device as claimed in claim 5 in which said inorganic insulation material is porous.

7. The thermoelectric semiconductor device as claimed in claim 5 in which said inorganic insulation material is a powder.

8. A thermoelectric semiconductor device in which a plurality or p-type and n-type thermoelectric semiconductor elements are arranged in a two-dimensional configuration and electrically connected alternatively in series to form p-n junctions for causing energy conversions between thermal energy and electrical energy characterized in that each of said p-type and n-type thermoelectric semiconductor elements consists of a porous material;

that spaces existing among said p-type and n-type semiconductor elements are filled with an inorganic insulation material; and that pores in each of said p-type and n-type thermoelectric semiconductor elements are deaerated into a vacuum of 1 mmHg or less.

9. The thermoelectric semiconductor device as claimed in claim 8 in which said inorganic insulation material is a porous material and pores in said material are deaerated into a vacuum equal to 1 mmHg or less.

10. The thermoelectric semiconductor device as claimed in claim 8 in which said inorganic insulation material is a powder.

11. An electronic refrigeration panel in which p-type and n-type semiconductor elements are electrically connected alternatively in series to form p-n junctions for causing energy conversions between thermal energy and electrical energy characterized in that each of said p-type and n-type semiconductor elements is comprised of semiconductor layers formed on surfaces of support particles *selected from the group consisting of hollow particles and porous particles,* and wherein said elements are in contact with each other.

12. The electronic refrigeration panel as claimed in claim 11 in which said semiconductor layers from a continuous sintered layer.

13. The electronic refrigeration panel as claimed in claim 11 in which said support particles are hollow particles.

14. The electronic refrigeration panel as claimed in claim 11 in which said support particles are porous particles.

15. A thermoelectric semiconductor device having a semiconductor block consisted of a porous body and electrodes formed on upper and lower end surfaces of said block being characterized in that said electrodes are made of an air-tight metal;

that side surfaces of said block are coated with an air-tight insulation material; and that said semiconductor block has been deaerated.

16. The thermoelectric semiconductor device as claimed in claim 15 in which said porous body is comprised of gas permeable support particles and a gas permeable thermoelectric semiconductive material supported by said support particles.

17. A thermoelectric semiconductor device comprising a pair of p-type and n-type semiconductor blocks each consisted of a porous body being characterized in that an insulation sheet material is inserted between said pair of p-type and n-type semiconductor blocks;

that said pair of p-type and n-type semiconductor blocks are electrically connected by a common electrode of an air-tight metal at one end thereof and, at another end thereof, each of said p-type and n-type semiconductor blocks is covered by an electrode of an air-tight metal;

that surfaces of said pair of p-type and n-type semiconductor blocks are covered by an air-tight insulation material; and that said pair of p-type and n-type semiconductor blocks are kept in a deaerated state.

18. The thermoelectric semiconductor device as claimed in claim 17 in which said porous body is comprised of gas permeable support particles and a gas permeable thermoelectric semiconductive material supported by said support particles.

19. The thermoelectric semiconductor device as claimed in claim 17 in which said insulation sheet material is gas-permeable.

20. A thermoelectric semiconductor device comprising:

an assembly of p-type and n-type semiconductor blocks arranged alternatively in a two-dimensional configuration, said each semiconductor block being porous and having electrodes of an air-tight metal material formed on both end surfaces thereof and side surfaces thereof being covered with an insulation material;

junction electrodes formed on upper and lower surfaces of said assembly of p-type and n-type semiconductor blocks each of which is made of an air-tight metal material and connects said electrodes of a pair of said p-type and n-type semiconductor blocks at each end surface of said assembly in such a manner that said p-type and n-type semiconductor blocks are electrically connected alternatively in series; and an air-tight insulation material covering outer surfaces of said assembly not covered by said junction electrodes, said air-tight insulation material and said junction electrodes maintaining said assembly in a deaerated state.

21. The thermoelectric semiconductor device as claimed in claim 20 in which said each semiconductor block is consisted of gas permeable support particles and a gas permeable thermoelectric semiconductive material supported by said support particles.

22. The thermoelectric semiconductor device as claimed in claim 20 in which said insulation material covering side surfaces of said each semiconductor block is gas permeable.

23. A thermoelectric semiconductor device comprising:

a support block consisted of a porous material;

a thermoelectric semiconductive layer formed on an outer surface of said support block, electrodes made of an air-tight metal material and formed on the upper and lower surfaces of said thermoelectric semiconductive layer; and an air-tight insulation layer formed on side surfaces of said thermoelectric semiconductive layer;

in which said support block is kept in a deaerated state by said electrodes and said air-tight insulation layer.

24. A thermoelectric semiconductor device comprising a pair of p-type and n-type semiconductor blocks being characterized in that each of said pair of p-type and n-type semiconductor blocks is consisted of a support block made of a porous material and a thermoelectric semiconductive layer formed supported by said support block;

that an insulation sheet material is inserted between said pair of p-type and n-type semiconductor blocks;

that said pair of p-type and n-type semiconductor blocks are electrically connected by a common electrode of an air-tight metal at one end thereof and, at another end thereof, each of said p-type and n-type semiconductor blocks is covered by an electrode of an air-tight metal;

that surfaces of said pair of p-type and n-type semiconductor blocks are covered by an air-tight insulation material; and that said pair of p-type and n-type semiconductor blocks are kept in a deaerated state.

25. A thermoelectric semiconductor device comprising an assembly of p-type and n-type semiconductor blocks arranged alternatively in a rectangular configuration, said each semiconductor block being consisted of a support block made of a porous material and a thermoelectric semiconductive layer formed supported on an outer surface of said support block and side surfaces of said each semiconductor block being covered by an air-tight insulation layer;

junction electrodes formed of upper and lower surfaces of said assembly of p-type and n-type semiconductor blocks each of which is made of an air-tight metal material and electrically connects each one end of a pair of p-type and n-type semiconductor blocks in such a manner that said p-type and n-type semiconductor blocks are electrically connected alternatively in series; and an air-tight insulation material covering outer surfaces of said assembly not covered by said junction electrodes: said air-tight insulation material and said junction electrodes maintaining said assembly in a deaerated state.

* * * * *

UNITED STATES PATENT AND TRADEMARK OFFICE

CERTIFICATE OF CORRECTION

PATENT NO. :

DATED : Re. 35,441

INVENTOR(S) : February 4, 1997

Youichirou YOKOTANI et al.

It is certified that error appears in the above-indentified patent and that said Letters Patent is hereby corrected as shown below:

On the cover page, item [73]: change "Matsushita Electrical Industrial Co., Ltd." to --Matsushita Electric Industrial Co., Ltd.--

Signed and Sealed this

Sixth Day of May, 1997

*Attest:*

*Attesting Officer*

BRUCE LEHMAN

*Commissioner of Patents and Trademarks*